United States Patent
Onodera et al.

(10) Patent No.: US 7,937,252 B2
(45) Date of Patent: May 3, 2011

(54) CMOS MODEL GENERATING APPARATUS AND METHOD, PROGRAM OF THE METHOD AND RECORDING MEDIUM

(75) Inventors: Hidetoshi Onodera, Otsu (JP); Xuliang Zhang, Kitakyushu (JP); Nobuto Ono, Sakura (JP)

(73) Assignees: Kyoto University (JP); Jedat Innovation Inc. (JP)

( * ) Notice: Subject to any disclaimer, the term of this patent is extended or adjusted under 35 U.S.C. 154(b) by 458 days.

(21) Appl. No.: 12/083,949

(22) PCT Filed: Oct. 23, 2006

(86) PCT No.: PCT/JP2006/321057
§ 371 (c)(1),
(2), (4) Date: Jun. 9, 2008

(87) PCT Pub. No.: WO2007/049555
PCT Pub. Date: May 3, 2007

(65) Prior Publication Data
US 2008/0262807 A1 Oct. 23, 2008

(30) Foreign Application Priority Data

Oct. 24, 2005 (JP) .................. 2005-308700

(51) Int. Cl.
*G06F 7/60* (2006.01)
*G06F 17/50* (2006.01)
*G06G 7/62* (2006.01)
*H01L 27/108* (2006.01)
*H01L 27/118* (2006.01)

(52) U.S. Cl. .................. 703/2; 703/13; 703/14; 257/68; 257/204

(58) Field of Classification Search ................ 703/2, 13, 703/14; 257/68, 204; 362/64, 65, 66, 71, 362/81, 84, 108, 110, 121
See application file for complete search history.

(56) References Cited

U.S. PATENT DOCUMENTS

| 5,966,527 | A * | 10/1999 | Krivokapic et al. | 703/14 |
| 6,304,836 | B1 * | 10/2001 | Krivokapic et al. | 703/14 |
| 7,197,728 | B2 | 3/2007 | Yonezawa | |

(Continued)

FOREIGN PATENT DOCUMENTS

JP 2002-43429 2/2002

(Continued)

OTHER PUBLICATIONS

"OPERA: Optimization with Ellipsoidal uncertaintly for Robust Analog IC design", Xu et al. Jun. 13-17, 2005.*

(Continued)

*Primary Examiner* — Jason Proctor
*Assistant Examiner* — Nithya Janakiraman
(74) *Attorney, Agent, or Firm* — Gerald E. Hespos; Michael J. Porco (57) ABSTRACT

A CMOS model generating apparatus 1 according to the present invention generates a CMOS model by converting an $I_n$-$I_p$ space into an $x_n$-$x_p$ space such that a typical condition TT and corner conditions FF, SS in the $I_n$-$I_p$ space become (0, 0), ($\alpha$, $\alpha$) and ($-\alpha$, $-\alpha$) in the $x_n$-$x_p$ space, determining an ellipse fitting to the respective mappings of the corner conditions FF, SS, FS and SF with the mapping (0, 0) of the typical condition TT as a center, expressing two independent principal components in the form of a Gaussian distribution using the major and minor axes of this ellipse as axes of the principal components, and obtaining a probability distribution determining deviations of the Gaussian distribution such that the cumulative probability within this ellipse becomes equal to the one presumed by the corner conditions FF, SS, FS and SF.

6 Claims, 5 Drawing Sheets

U.S. PATENT DOCUMENTS

2002/0035462 A1 3/2002 Kidera et al.
2002/0037596 A1* 3/2002 Yamaguchi .................... 438/11

FOREIGN PATENT DOCUMENTS

| | | |
|---|---|---|
| JP | 2002-261266 | 9/2002 |
| JP | 2005-11892 | 1/2005 |
| JP | 2005-257660 | 9/2005 |

OTHER PUBLICATIONS

"Paramter Variation on Chip-Level", Schaper, et al. IEEE 2005 Int. Conference on Microelectronic Test Structures. vol. 18, Apr. 2005.*

"Statistical Device Models from Worst Case Files and Electrical Test Data". Singhal, et al. IEEE Transactions on Semiconductor Manufacturing, vol. 12, No. 4, Nov. 1999.*

"Statistical Modeling of MOS Transistors with Intra-chip Variability" by Kenichi Okada et al.—Journal of Information Processing, vol. 43, No. 5, May 2002.

"Nikkei Microdevices" published by Nikei BP, Mar. 2005, p. 92-p. 93.

* cited by examiner

CMOS MODEL GENERATING APPARATUS AND METHOD, PROGRAM OF THE METHOD AND RECORDING MEDIUM

BACKGROUND OF THE INVENTION

1. Field of the Invention

The present invention relates an apparatus and a method for generating a CMOS model and particularly to CMOS model generating apparatus and method for generating a CMOS model taking distributions of variation in an n-channel MOS transistor and a p-channel MOS transistor suitable for Monte Carlo analysis into account. The present invention also relates to a CMOS model generating program of such a CMOS model generating method and a recording medium storing this CMOS model generating program.

2. Description of the Related Art

Transistors to be integrated into an integrated circuit, e.g. an n-channel MOS transistor (hereinafter, abbreviated as "nMOS") and a p-channel MOS transistor (hereinafter, abbreviated as "pMOS") of a CMOS (Complementary Metal Oxide Semiconductor) are known to have various characteristics that vary between chips of a wafer or in the chips (see, for example, Non-Patent Literature 1).

Figure 4A:
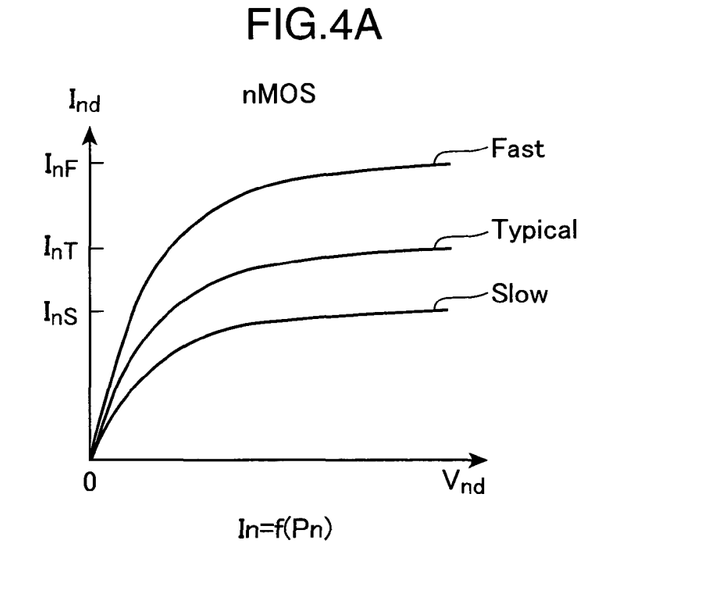
Figure 4B:
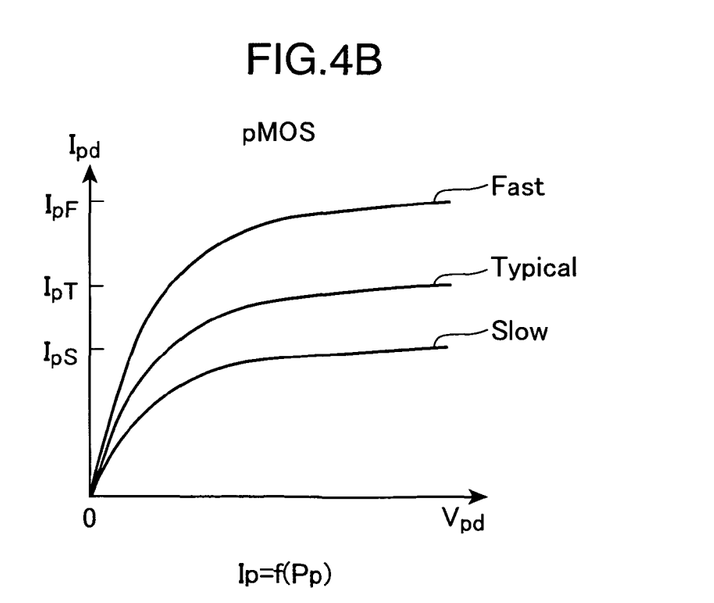
Figure 5A:
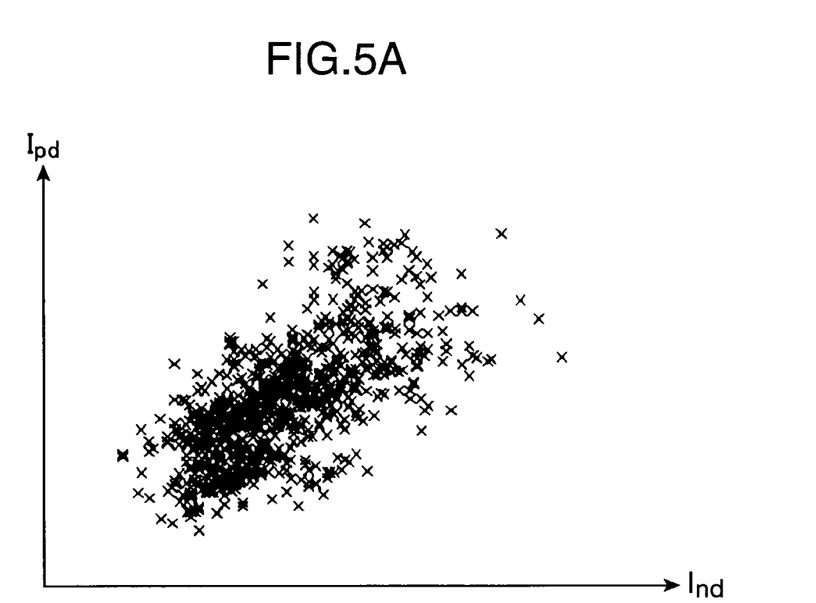
Figure 5B:
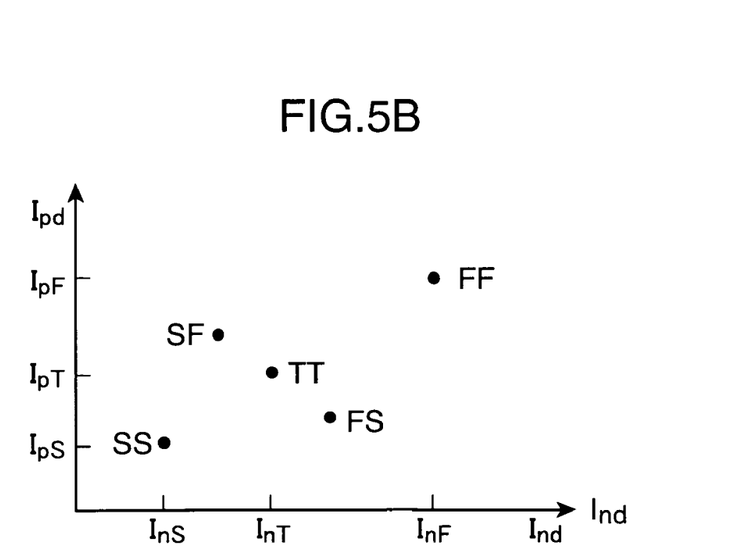

FIG. 4 are graphs showing voltage-current characteristics between sources and drains of MOS transistors. FIG. 4A is a graph showing the voltage-current characteristics between the source and drain of an nMOS and FIG. 4B is a graph showing the voltage-current characteristics between the source and drain of a pMOS. Horizontal axes of FIG. 4 represent drain voltage $V_d$ and vertical axes represent drain current $I_d$. It is assumed that the polarity of voltages and currents relating to the pMOS is opposite to that relating to the nMOS. FIG. 5 are scatter diagrams showing a correlation of a saturation current of the nMOS and that of the pMOS. FIG. 5A shows the result of actual measurements and FIG. 5B shows points FF, SS, FS, SF and TT. Here, suffix n indicates the case of the nMOS and suffix p indicates the case of the pMOS.

As shown in FIG. 4, the voltage-current characteristics between the sources and drains of the nMOS and pMOS (hereinafter, abbreviated as "voltage-current characteristics") are changes of the drain currents $I_d$ flowing between the sources and drains in relation to changes of the drain voltages $V_d$ between the sources and drains in the case of applying a specified constant gate voltage $V_g$ between the sources and gates. The voltage-current characteristics roughly have such profiles that the drain current $I_d$ saturates at a substantially constant level after linearly increasing as the drain voltage $V_d$ increases. The voltage-current characteristics having such profiles vary from a characteristic with a small drain current $I_d$ (hereinafter, called "Slow") to a characteristic with a large drain current $I_d$ (hereinafter, called "Fast") due to variations of production conditions even if the same gate voltage $V_g$ is applied as shown in FIG. 4. Such Slow and Fast are characteristics with smaller occurrence frequencies than a statistical representative value (average value, median, etc.), specify the limits of variations, and are generally called "corners". In the Fast, the response speed is relatively fast since the drain current $I_d$ is large. In the Slow, the response speed is relatively slow since the drain current $I_d$ is relatively small.

Actually, various characteristics exist from Slow to Fast, but only Slow, Fast and Typical are shown, but the others are not shown in FIG. 4. This Typical is a typical voltage-current characteristic with a largest occurrence frequency that can be a statistical representative value. $V_{nd}$ and $I_{nd}$ denote the drain voltage $V_d$ and the drain current $I_d$ of the nMOS, and $V_{pd}$ and $I_{pd}$ denote the drain voltage $V_d$ and the drain current $I_d$ of the pMOS. The drain current $I_d$ in the case where the voltage-current characteristic saturates is called a saturation current I; $I_{nS}$, $I_{nF}$ and $I_{nT}$ denote the saturation currents $I_n$ of the Slow, Fast and Typical of the nMOS; and $I_{pS}$, $I_{pF}$ and $I_{pT}$ denote the saturation currents $I_p$ of the Slow, Fast and Typical of the pMOS. Of course, relationships $I_{nS} < I_{nT} < I_{nF}$ and $I_{pS} < I_{pT} < I_{pF}$ hold.

In a CMOS including the nMOS and pMOS, the voltage-current characteristics of the nMOS and pMOS vary and there is a correlation between the nMOS and the pMOS. Thus, in an $I_n$-$I_p$ space defined by the saturation current $I_n$ of the nMOS and the saturation current $I_p$ of the pMOS with a horizontal axis representing the saturation $I_n$ of the nMOS and a vertical axis representing the saturation $I_p$ of the pMOS, a relationship between the saturation current $I_n$ of the nMOS and the saturation current $I_p$ of the pMOS is as shown in a distribution scatter diagram of FIG. 5.

Thus, in the case of designing a CMOS integrated circuit, a designer simulates characteristics of the designed integrated circuit using a circuit simulator such as a SPICE (Simulation Program with Integrated Circuited Emphasis) in order to obtain a chip satisfying a specified specification and to ensure a sufficient yield rate. The designer has to consider such variations of the nMOS and pMOS constituting the CMOS. To this end, the characteristics may be guaranteed by simulating the respective points in the scatter diagram shown in FIG. 5A, but this method is difficult since it is difficult to statistically generate the respective points of the scatter diagram shown in FIG. 5A and there is no method for converting the points into model parameters in the original SPICE even if these points could be determined. Thus, conventionally, the characteristics have been guaranteed by performing simulations for corner chips (worst cases chips) and a typical chip shown in FIG. 5A. Specifically, as shown in FIG. 5B, for the respective cases of a state FF where the response speeds of the nMOS and pMOS are both fast (corner condition FF), a state SS where the response speeds of the nMOS and pMOS are both slow (corner condition SS), a state FS where the response speed of nMOS is fast and that of the pMOS is slow (corner condition FS), a state SF where the response speed of nMOS is slow and that of pMOS is fast (corner condition SF) and a state TT where the response speeds of the nMOS and pMOS are both typical (typical condition TT), the values of parameters in device models of the nMOS and pMOS generated for the circuit simulation have been transmitted from a production side (processing department) to a design side, and the characteristics of the designed integrated circuit have been simulated using these values of parameters to guarantee the characteristics. Such a design method is called a worst design technique and disclosed, for example, in Patent Literature 1 and Non-Patent Literature 2.

Since the characteristics of the integrated circuit are evaluated for the five states, i.e. the above corner conditions FF, SS, FS and SF and the typical condition TT shown in FIG. 5B according to the background art, these evaluations do not take the distributions of variation in the nMOS and pMOS into account and these five states are discrete. Therefore, it is not possible to obtain a distribution of variation in the characteristic of the integrated circuit.

Particularly, in integrated circuits produced by a fine process of the recent years, all the nMOSs and pMOSs do not vary toward the same corner and the nMOSs and pMOSs vary in various manners as shown in FIG. 5A. Thus, the characteristic of the integrated circuit needs to be evaluated in consideration of the distributions of characteristic variation in the nMOSs and pMOSs. Particularly, since targets of the characteristics are diverse and continuous in the design of analog circuits, whether or not the design is good is judged not only by the characteristics at the corners as in the design of digital circuits, but by referring to the continuous distributions of the characteristics in many cases. Therefore, it is important to obtain the distributions of characteristic variation.
[Patent Literature 1]

SUMMARY OF THE INVENTION

In view of the above situation, an object of the present invention is to provide CMOS model generating apparatus and method capable of generating a CMOS model taking distributions of variation in an nMOS and a pMOS into account. Another object of the present invention is to provide a program of such a CMOS model generating method and a recording medium storing this program.

In the present invention, an $I_n$-$I_p$ space defined by a saturation current $I_n$ of an n-channel MOS transistor and a saturation current $I_p$ of a p-channel MOS transistor is converted into an $x_n$-$x_p$ space defined by a parameter $x_n$ indicating the degree of variation of the saturation current $I_n$ of the n-channel MOS transistor in a target CMOS model and a parameter $x_p$ indicating the degree of variation of the saturation current $I_p$ of the p-channel MOS transistor in the target CMOS model; an ellipse fitting to mapped points of corner conditions FF, SS, FS and SF with a mapped point of a typical condition TT as a center is determined; two independent principal components are expressed in the form of a Gaussian distribution using the major and minor axes of this ellipse as axes of the principal components; and a probability distribution determining deviations of the Gaussian distribution such that the cumulative probability within the ellipse becomes equal to the one presumed by the corner conditions FF, SS, FS and SF is obtained as the CMOS model.

According to this invention, there can be generated a CMOS model taking distributions of variation in the nMOS and pMOS into account.

DETAILED DESCRIPTION OF THE PREFERRED EMBODIMENTS

Figure 1:
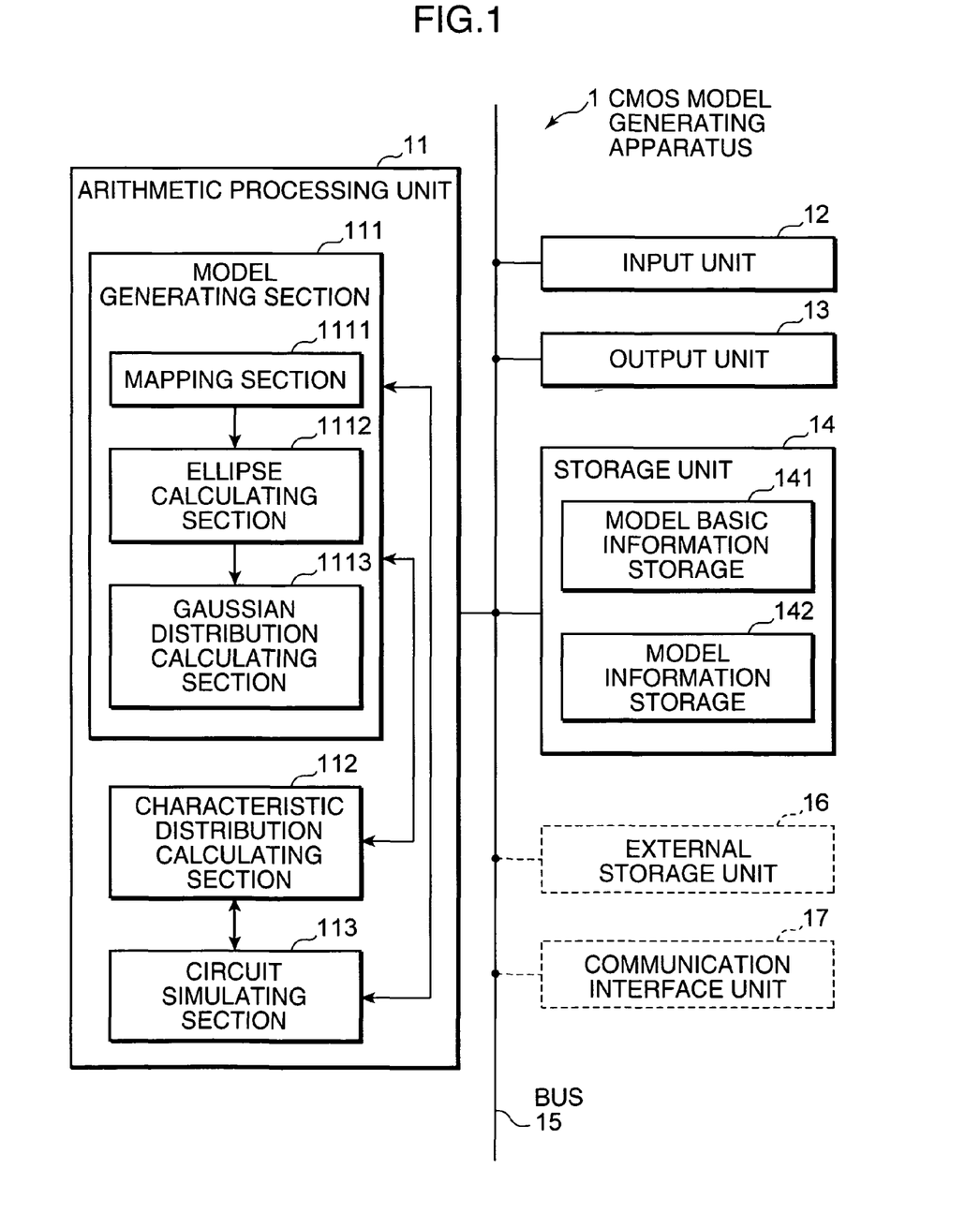
FIG. 1 is a block diagram showing the construction of a CMOS model generating apparatus according to one embodiment.

Hereinafter, one embodiment of the present invention is described with reference to the accompanying drawings. Constructions identified by the same reference numerals in the respective drawings are identical and not described repeatedly.
(Construction of Embodiment)
FIG. 1 is a block diagram showing the construction of a CMOS model generating apparatus according to one embodiment. In FIG. 1, a CMOS model generating apparatus 1 is provided with an arithmetic processing unit 11, an input unit 12, an output unit 13, a storage unit 14 and a bus 15.

The input unit 12 is a device used to input various commands such as a command instructing the start of generating a CMOS model and various data necessary to generate the CMOS model such as model basic information to the CMOS model generating apparatus 1 and is, for example, a keyboard, a mouse or the like.

The model basic information includes the values of parameters in an nMOS model and a pMOS model for giving a saturation current $I_n$ of the nMOS and a saturation current $I_p$ the pMOS in the respective states of corner conditions FF, SS, FS and SF and a typical condition TT. An nMOS model and a pMOS model for circuit simulation representing the nMOS and pMOS are, for example, constituted by a plurality of parameters such as channel lengths, channel widths, gate oxide film thicknesses, gate capacities and ion implantation concentrations (hereinafter, called as "parameter sets"). Various device models have been developed as the nMOS model and pMOS model for circuit simulation, and parameters constituting the parameter sets in conformity with the nMOS and pMOS to be produced are selected and generated by production side (processing department). Accordingly, if it is assumed that $P_{nF}$, $P_{nS}$, $P_{nFS}$, $P_{nSF}$ and $P_{nT}$ denote the values of parameters of the nMOS model for giving the saturation current $I_n$ of the nMOS and $P_{pF}$, $P_{pS}$, $P_{pFS}$, $P_{pSF}$ and $P_{pT}$ denote the values of parameters of the pMOS model for giving the saturation current $I_p$ of the pMOS in the respective states of the corner conditions FF, SS, FS and SF and the typical condition TT, the model basic information is FF=($P_{nF}$, $P_{pF}$), SS=($P_{nS}$, $P_{pS}$), FS=($P_{nFS}$, $P_{pFS}$) SF=($P_{nSF}$, $P_{pSF}$) and TT=($P_{nT}$/$P_{pT}$) in an $I_n$-$I_p$ space defined by the saturation current $I_n$ of the nMOS and the saturation current $I_p$ of the pMOS. Of course, since $P_{nF}$, $P_{nS}$, $P_{nFS}$, $P_{nSF}$, $P_{nT}$ and $P_{pF}$, $P_{pS}$, $P_{pFS}$, $P_{pSF}$, $P_{pT}$ are specific values of a plurality of specific parameters constituting the parameter sets since the nMOS model and pMOS model are constituted by the parameter sets. For example, if the respective parameters of the nMOS model for giving the saturation current $I_{nF}$ of the nMOS on the condition FF are ($a_{n1}$, $a_{n2}$, $a_{n3}$, ...) in the case where the nMOS model is ($A_{n1}$, $A_{n2}$, $A_{n3}$, ...), $P_{nF}$=($a_{n1}$, $a_{n2}$, $a_{n3}$, ...), where $a_{n1}$, $a_{n2}$, $a_{n3}$, ... are specific numerical values.

Upon obtaining the respective values of the corner conditions FF, SS, FS and SF and the typical condition TT, a scatter diagram showing a relationship between the saturation current $I_n$ of the nMOS and the saturation current $I_p$ of the pMOS as shown in FIG. 5 is first generated, for example, by actually measuring a plurality of samples at the production side (processing department). Subsequently, the respective points of the corner conditions FF, SS, FS and SF and the typical condition TT are determined from this generated scatter diagram. Then, the respective values of the corner conditions FF, SS, FS and SF and the typical condition TT are obtained from these determined points. Here, the saturation current $I_n$ of the nMOS and the saturation current $I_p$ of the pMOS on the condition FF are the saturation current $I_{nF}$ of the nMOS and the saturation current $I_{pF}$ of the pMOS in Fast; the saturation current $I_n$ of the nMOS and the saturation current $I_p$ of the pMOS on the condition SS are the saturation current $I_{nS}$ of the nMOS and the saturation current $I_{pS}$ of the pMOS in Slow; and the saturation current $I_n$ of the nMOS and the saturation current $I_p$ of the pMOS on the condition TT are the saturation current $I_{nT}$ of the nMOS and the saturation current $I_{pT}$ of the pMOS in Typical.

The scatter diagram of the saturation current $I_n$ of the nMOS and the saturation current $I_p$ of the pMOS may be generated by executing a Monte Carlo analysis for the nMOS model and pMOS model. The Monte Carlo analysis is a method of generating data using random numbers for a given event and obtaining an approximate solution by repeating a simulation a sufficiently large number of times on the premise that an event stochastically occurs. For example, in the case of generating the scatter diagram showing the relationship of the saturation current $I_n$ of the nMOS and the saturation current $I_p$ of the pMOS, parameters influential to the saturation current $I_n$ of the nMOS are first selected out of the parameters of the parameter set of the nMOS model, the values of the parameters are generated using random numbers for these selected parameters and the value of the saturation current $I_n$ of the nMOS is simulated using these generated values of the parameters. A similar simulation is performed also for the saturation current $I_{pd}$ of the pMOS to obtain the value. The simulations for obtaining the value of the saturation current $I_{nd}$ of the nMOS and the value of the saturation current $I_{pd}$ of the pMOS are repeated a sufficiently large number of times, e.g. 5000 times, 10000 times or 20000 times.

The output unit 13 is a device for outputting commands and data inputted from the input unit 12, the CMOS model generated by this CMOS model generating apparatus 1, the analysis result of the Monte Carlo analysis using this CMOS model and the like and is, for example, a display device such as a CRT display, an LCD, an organic EL display or a plasma display or a printing apparatus such as a printer.

The storage unit 14 is functionally provided with a model basic information storage 141 for storing the model basic information and a model information storage 142 for storing the model information of the generated CMOS model, and stores various programs including a CMOS model generating program for generating the model information of the CMOS model from the model basic information, a circuit simulation program such as a SPICE for performing a circuit simulation including the Monte Carlo analysis and a control program for controlling the respective parts of the CMOS model generating apparatus 1 and various data such as data necessary for the execution of various programs and data generated during the execution of these programs. The storage unit 14 includes, for example, a volatile storage element such as a RAM (Random Access Memory) as a so-called working memory of the arithmetic processing unit 11, a nonvolatile storage element such as a ROM (Read Only Memory), a hard disk device for saving various programs and various data, etc.

The SPICE is a general-purpose electronic circuit simulation program developed by University of California at Berkley in the United States, and source codes are generally made public. Thus, derived SPICEs with the extension of functions and/or improvements such as PSpice are also known. It should be noted that the Monte Carlo analysis is also incorporated into this PSpice. The SPICE calculates various characteristics of a circuit such as a voltage-current characteristic, gain and phase frequency characteristics and an input/output characteristic based on a file called a net list describing connection information between parts constituting the circuit and a file called a model library describing device models of the parts.

The arithmetic processing unit 11 includes, for example, a microprocessor and its peripheral circuits, is functionally provided with a model generating section 111, a characteristic distribution calculating section 112 and a circuit simulating section 113 for performing the circuit simulation including the Monte Carlo analysis, and controls the input unit 12, the output unit 13 and the storage unit 14 according to their functions in accordance with the control program.

The model generating section 111 generates the model information of the CMOS model reflecting a distribution of occurrence frequencies in the relationship of the saturation current $I_n$ of the nMOS and the saturation current $I_p$ of the pMOS based on the model basic information. The model generating section 111 is functionally provided with a mapping section 1111, an ellipse calculating section 1112 and a Gaussian distribution calculating section. The mapping section 1111 converts the $I_n$-$I_p$ space defined by the saturation current $I_n$ of the nMOS and the saturation current $I_p$ of the pMOS into an $x_n$-$x_p$ space defined by a parameter $x_n$ indicating the degree of variation of the saturation current $I_n$ of the nMOS in the CMOS model and a parameter $x_p$ indicating the degree of variation of the saturation current $I_p$ of the pMOS in the CMOS model. The ellipse calculating section 1112 determines an ellipse fitting to the respective converted points of the corner conditions FF, SS, FS and SF by the mapping section 1111 with the converted point of the typical condition TT by the mapping section 1111 as a center. The Gaussian distribution calculating section 1113 expresses two independent principal components in the form of a Gaussian distribution using the major and minor axes of the ellipse determined by the ellipse calculating section 1112 as axes of these principal components, and obtains a probability distribution, as the CMOS model, obtained by determining deviations of the Gaussian distribution such that the cumulative probability within this ellipse is equal to the one presumed by the corner conditions FF, SS, FS and SF. There is no variation of the saturation current $I_n$ of the nMOS if the value of $x_n$ is 0, and the amount of variation of the saturation current $I_n$ of the nMOS increases as this value increases or decreases. The same holds true for $x_p$.

The characteristic calculating section 112 generates the parameter values of $x_n$ and $x_p$ by generating random numbers in such a manner as to comply with the Gaussian distribution as the CMOS model obtained by the model generating section 111. The arithmetic processing unit 11 obtains the distribution of the characteristic of the CMOS by carrying out the Monte Carlo analysis in the circuit simulating section 113 using the parameter values of $x_n$ and $x_p$ obtained by the characteristic distribution calculating section 112.

These arithmetic processing unit 11, input unit 12, output unit 13 and storage unit 14 are respectively connected via the bus 15 so as to be able to exchange signals with each other.

These arithmetic processing unit 11, input unit 12, output unit 13, storage unit 14 and bus 15 can be constructed, for example, by a computer, more specifically by a personal computer such as a notebook personal computer or a desktop personal computer.

Next, the operation of this embodiment is described.
(Operation of the Embodiment)

Figure 2:
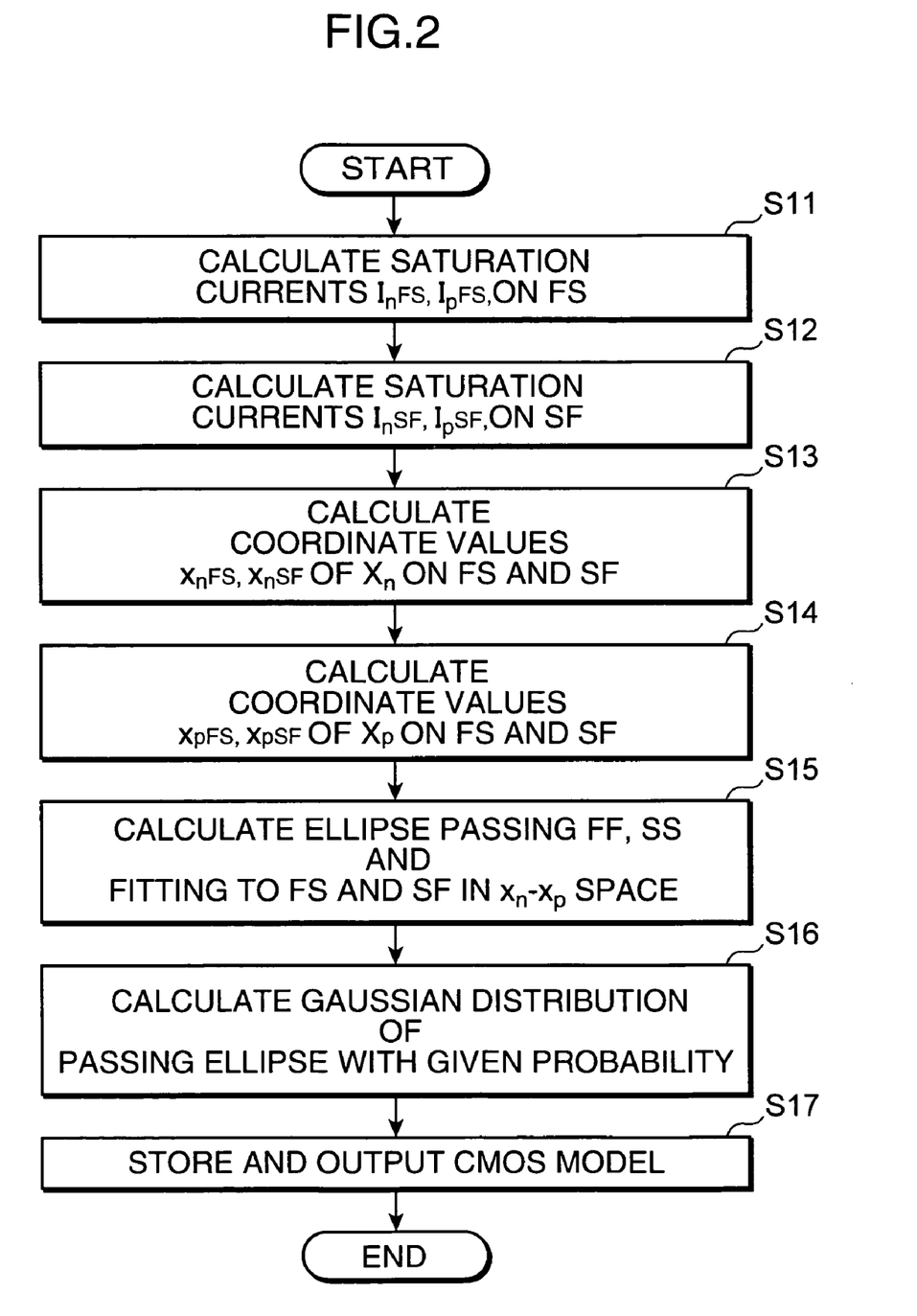
FIG. 2 is a flow chart showing the operation of the CMOS model generating apparatus according to the embodiment, FIG. 3 are graphs showing a method for generating CMOS model, FIG. 4 are graphs showing voltage-current characteristics between sources and drains of MOS transistors, and FIG. 5 are scatter diagrams showing a correlation between a saturation current of an nMOS and that of a pMOS.
Figure 3A:
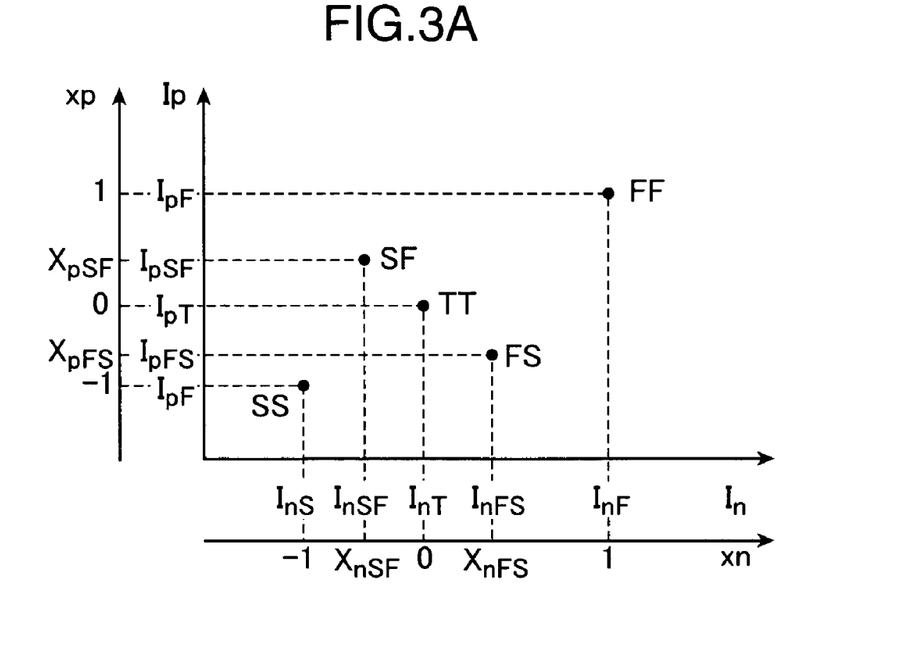
Figure 3B:
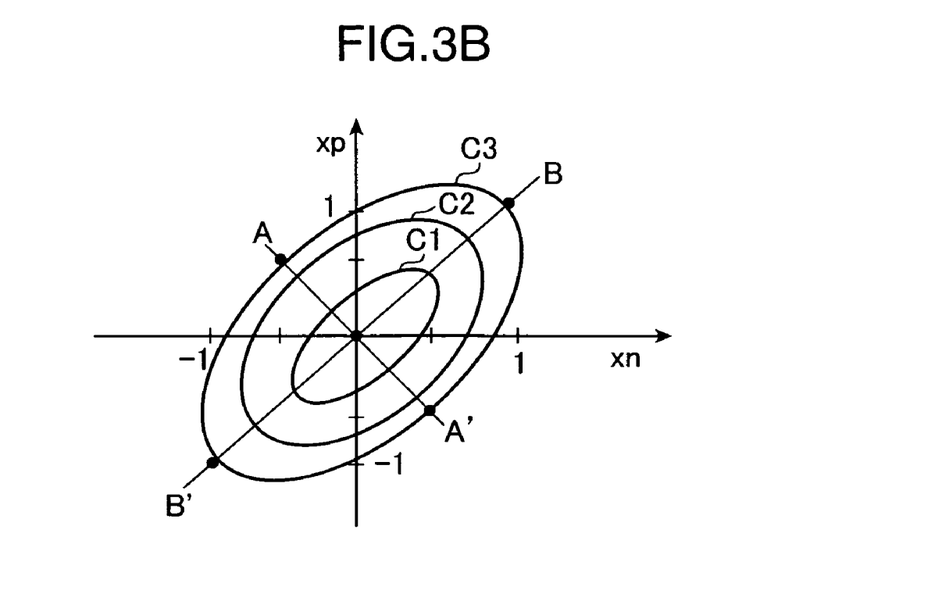

FIG. 2 is a flow chart showing the operation of the CMOS model generating apparatus according to this embodiment, and FIG. 3 are graphs showing a method for generating the CMOS model. FIG. 3A shows a correlation between the $I_n$-$I_p$ space and the $x_n$-$x_p$ space and also the corner conditions FF, SS, FS and SF and the typical condition TT in the both spaces. FIG. 3B shows the generated CMOS model.

First of all, the respective values of the corner conditions FF, SS, FS and SF and the typical condition TT given from the production side (processing department), i.e. the specific values $P_{nF}$, $P_{nS}$, $P_{nFS}$, $P_{nSF}$, $P_{nT}$ and $P_{pF}$, $P_{pS}$, $P_{pFS}$, $P_{pSF}$, $P_{pT}$ of a plurality of parameters constituting the parameter sets are inputted to the CMOS model generating apparatus 1 by means of the input unit 12 and stored as the model basic information in the model basic information storage 141 of the storage unit 14. Then, when a command instructing the start of generating a CMOS model is inputted to the CMOS model generating apparatus 1 by means of the input unit 12, the CMOS model generating program is executed and the model generating section 111 of the arithmetic processing unit 11 starts generating the CMOS model based on the model basic information.

Upon obtaining this CMOS model, the $I_n$-$I_p$ space is converted into the $x_n$-$x_p$ space by the mapping section 1111 such that the typical condition TT and the corner conditions FF and SS in the $I_n$-$I_p$ space become (0, 0), (α, α) and (−α, −α) in the $x_n$-$x_p$ space. Subsequently, an ellipse fitting to the respective converted points of the corner conditions FF, SS, FS and SF by the mapping section 1111 with the converted point (0, 0) of the typical condition TT by the mapping section 1111 as a center is determined. Then, the two independent principal components are respectively expressed in the form of a Gaussian distribution using the major and minor axes of this ellipse as the axes of these principal components, and the probability distribution determining the deviations of the Gaussian distribution such that the cumulative probability in this ellipse becomes equal to the one presumed by the corner conditions FF, SS, FS and SF is obtained. In this way, this CMOS model is generated. It should be noted that a may be an arbitrary value, but α=1 in this embodiment for simplicity.

Specifically, in FIG. 2, the mapping section 1111 of the model generating section 111 performs the circuit simulation using the circuit simulating section 113, thereby calculating the saturation current $I_{nFS}$ of the nMOS and the saturation current $I_{pFS}$ of the pMOS on the corner condition FS from $P_{nFS}$ and $P_{pFS}$ stored in the model basic information storage 141 (S11). Subsequently, the mapping section 1111 of the model generating section 111 performs the circuit simulation using the circuit simulating section 113, thereby calculating the saturation current $I_{nSF}$ of the nMOS and the saturation current $I_{pSF}$ of the pMOS on the corner condition SF from $P_{nSF}$ and $P_{pSF}$ stored in the model basic information storage 141 (S12).

Subsequently, the mapping section 1111 of the model generating section 111 performs the circuit simulation using the circuit simulating section 113, thereby calculating coordinate values $x_{nFS}$ and $x_{nSF}$ of $x_n$ on the corner conditions FS, SF (S13).

More specifically, equation 1 for giving the values of parameters of the nMOS satisfying the typical condition TT= (0, 0) and the corner conditions FF=(1, 1) and SS=(−1, −1) is generated. The typical condition TT, and the corner conditions FF, SS are set to (0, 0), (1, 1) and (−1, −1) so that the saturation current $I_{nF}$ of the corner condition FF on the axis of the saturation current $I_n$ of the nMOS corresponds to 1 on the axis of $x_n$, the saturation current $I_{nS}$ of the corner condition SS on the axis of the saturation current $I_n$ of the nMOS corresponds to −1 on the axis of $x_n$, the saturation current $I_{nT}$ of the typical condition TT on the axis of the saturation current $I_n$ of the nMOS corresponds to 0 on the axis of $x_n$, the saturation current $I_{pF}$ of the corner condition FF on the axis of the saturation current $I_p$ of the pMOS corresponds to 1 on the axis of $x_p$, the saturation current $I_{pS}$ of the corner condition SS on the axis of the saturation current $I_p$ of the pMOS corresponds to −1 on the axis of $x_p$, the saturation current $I_{pT}$ of the typical condition TT on the axis of the saturation current $I_p$ of the pMOS corresponds to 0 on the axis of $x_p$ as shown in FIG. 3.

$$P_n = P_{nT} + x_n \times (P_{nF} - P_{nT}) \text{ where } x_n \geq 0 \qquad (1)$$
$$= P_{nT} - x_n \times (P_{nS} - P_{nT}) \text{ where } x_n < 0.$$

By using the respective values obtained by equation (1) while $x_n$ is changed at specified intervals from −1 to +1 as the respective values $P_{nFS}$ of the parameter on the corner condition FS in the circuit simulating section 113, the respective saturation currents $I_n$ of the nMOS are obtained. Out of these obtained saturation currents $I_n$ of the nMOS, the one coinciding with or closest to the saturation current $I_{nFS}$ of the nMOS obtained in Step S11 is selected. $x_n$ giving the value $P_{nFS}$ of the parameter corresponding to this selected saturation current $I_n$ of the nMOS is the coordinate value $x_{nFS}$ of $x_n$ on the corner condition FS. Similarly, out of these obtained saturation currents $I_n$ of the nMOS, the one coinciding with or closest to the saturation current $I_{nSF}$ of the nMOS obtained in Step S12 is selected. $x_n$ giving the value $P_{nSF}$ of the parameter corresponding to this selected saturation current $I_n$ of the nMOS is the coordinate value $x_{nSF}$ of $x_n$ on the corner condition SF. Here, the specified interval is determined by the required accuracies of the coordinate values $x_{nFS}$ and $x_{nSF}$ and, for example, an interval of 0.01, an interval of 0.001 or the like.

Subsequently, the mapping section 1111 of the model generating section 111 performs the circuit simulation using the circuit simulating section 113, whereby the coordinate values $x_{pFS}$ and $x_{pSF}$ of $x_n$ on the corner conditions FS and SF are calculated (S14).

More specifically, similar to Step S13, equation (2) for giving values of the parameters of the pMOS model satisfying the respective typical condition TT=(0, 0) and corner conditions FF=(1, 1) and SS=(−1, −1) is generated.

$$P_p = P_{pT} + x_p \times (P_{pF} - P_{pT}) \text{ where } x_p \geq 0 \qquad (2)$$
$$= P_{pT} - x_p \times (P_{pS} - P_{pT}) \text{ where } x_p < 0.$$

By using the respective values obtained by equation (2) while $x_p$ is changed at specified intervals from −1 to +1 as the respective values $P_{pFS}$ of the parameter on the corner condition FS in the circuit simulating section 113, the respective saturation currents $I_p$ of the pMOS are obtained. Out of these obtained saturation currents $I_p$ of the pMOS, the one coinciding with or closest to the saturation current $I_{pFS}$ of the pMOS obtained in Step S11 is selected. $x_p$ giving the value $P_{pFS}$ of the parameter corresponding to this selected saturation current $I_p$ of the pMOS is the coordinate value $x_{pFS}$ of $x_p$ on the corner condition FS. Similarly, out of these obtained saturation currents $I_p$ of the pMOS, the one coinciding with or closest to the saturation current $I_{pSF}$ of the pMOS obtained in Step S12 is selected. $x_p$ giving the value $P_{pSF}$ of the parameter corresponding to this selected saturation current $I_p$ of the pMOS is the coordinate value $x_{pSF}$ of $x_p$ on the corner condition SF.

As described above, in this embodiment, the mapping section 1111 first obtains the saturation current $I_{nFS}$ of the nMOS and the saturation current $I_{pFS}$ of the pMOS based on the values $P_{nFS}$, $P_{pFS}$) of the parameters on the corner condition FS and obtains the saturation current $I_{nSF}$ of the nMOS and the saturation current $I_{pSF}$ of the pMOS based on the values ($P_{nSF}$, $P_{pSF}$) of the parameters on the corner condition SF. Subsequently, the mapping section 1111 sets the coordinate values on the typical condition TT and the corner conditions FF, SS in the $x_n$-$x_p$ space representing the CMOS model to (0, 0), (1, 1) and (−1, −1), and obtains the coordinate values ($x_{nFS}$, $x_{pFS}$) and ($x_{nSF}$, $x_{pSF}$) on the corner conditions FS, SF in the $x_n$-$x_p$ space based on the thus obtained saturation currents $I_{nFS}$, $I_{nSF}$ of the nMOS and saturation currents $I_{pFS}$, $I_{pSF}$ of the pMOS on the corner conditions FS, SF using a function expression representing the relationship between the values of the parameters of the nMOS model and pMOS model and the coordinate values in the $x_n$-$x_p$ space and equations (1) and (2).

Subsequently, the ellipse calculating section 1112 of the model generating section 111 determines an ellipse C3 most fitting to the respective mappings (1, 1), ($x_{nSF}$, $x_{pSF}$), (−1, +1) and ($x_{nFS}$, $x_{pFS}$) of the corner conditions FF, SF, SS and FS with the mapping (0, 0) of the typical condition TT as a center in the $x_n$-$x_p$ space as shown in FIG. 3B (S15). Specifically, there is determined such an ellipse as to minimize the sum of the square of a distance between the ellipse C3 and (1, 1), the square of a distance between the ellipse C3 and ($x_{nSF}$, $x_{pSF}$), the square of a distance between the ellipse C3 and (−1, −1) and the square of a distance between the ellipse C3 and ($x_{nFS}$, $x_{pFS}$). Alternatively, in order to more quickly perform the arithmetic processing by simplifying the computation, the ellipse calculating section 1112 of the model generating section 111 may determine an ellipse C3 passing the respective mappings (1, 1) and (−1, −1) of the corner conditions FF, SS and most fitting to the respective mappings ($x_{nSF}$, $x_{pSF}$) and ($x_{nFS}$, $x_{pFS}$) of the corner conditions SF, FS determined in Steps S13 and S14 with the mapping (0, 0) of the typical condition TT as a center in the $x_n$-$x_p$ space. In other words, there is determined such an ellipse as to minimize the sum of the square of a distance between the ellipse C3 and ($x_{nSF}$, $x_{pSF}$) and the square of a distance between the ellipse C3 and ($x_{nFS}$, $x_{pFS}$).

Subsequently, the Gaussian distribution calculating section 1113 of the model generating section 111 uses a major axis BB' and a minor axis AA' of the ellipse as axes of independent two principal components and expresses the respective principal components, for example, in the form of a Gaussian distribution (normal distribution) assuming that the respective points on the determined ellipse C3 have an equal probability, and generates a probability distribution determining deviations of the Gaussian distribution such that the cumulative probability within the ellipse C3 becomes equal to the one presumed by the respective corner conditions FF, SS, FS and SF as the CMOS model (S16). It should be noted that ellipses C2, C1 of FIG. 3B are also traces of points with an equal probability. The cumulative probability is an integral value of probabilities of occurrence in a given interval or of probability densities in a given interval. For example, the cumulative probability in a range of 3σ (σ is a standard deviation) in a Gaussian distribution is about 99.73% as generally known.

The model generating section 111 stores the generated CMOS model in the model information storage 142 of the storage unit 14 and outputs it to the output unit 13 (S17).

The thus generated CMOS model is a model reflecting the distributions of variation in the nMOS and pMOS, and the distributions of variation in the nMOS and pMOS can be expressed only by the two parameters of $x_n$ and $x_p$. The distribution of a certain characteristic of the CMOS has conventionally had to be determined by executing the Monte Carlo analysis through the variation of the respective parameters constituting the respective parameter sets of the nMOS model and pMOS model. However, the CMOS mode according to the present invention can be determined by executing the Monte Carlo analysis only through the variation of the two parameters of $x_n$ and $x_p$. Accordingly, the determination of the distribution of the certain characteristic of the CMOS was conventionally difficult and not realistic because a large number of parameters were varied, but can be easily realized in the MOS model according to the present invention since only two parameters are varied.

In the Monte Carlo analysis using this CMOS model, the characteristic distribution calculating section 112 of the arithmetic processing unit 11 first generates the random numbers in such a manner as to comply with the Gaussian distribution as the CMOS model determined in the Gaussian distribution calculating section 1113 of the model generating section 111, thereby generating the parameter values $x_n$ and $x_p$. The arithmetic processing unit 11 executes a Monte Carlo analysis according to a desired characteristic in the circuit simulating section 113 using these parameter values $x_n$ and $x_p$ calculated by the characteristic distribution calculating section 112. In this way, the distribution of the certain characteristic of the CMOS can be determined.

In the above embodiment, the circuit simulating section 113 for performing the circuit simulation may be provided separately from the CMOS model generating apparatus 1.

In the above embodiment, the CMOS generating apparatus 1 may further include an external storage unit 16 and/or a communication interface unit 17 as shown by broken line if necessary. The external storage unit 16 is a device for reading and/or writing data from and/or on recording media such as flexible disks, CD-ROMs (Compact Disc Read Only Memories), CD-Rs (Compact Disc Recordables) and DVD-Rs (Digital Versatile Disc Recordables) and, for example, a flexible disk drive, CD-ROM drive, CD-R drive or a DVD-R drive. The communication interface unit 17 is an interface circuit connected with an external network such as a telephone network, a digital communication network or a radio communication network or a network such as a local area network for transmitting and receiving communication signals to and from communication terminals such as a server computer via the network, generates communication signals in accordance with a communication protocol of the network based on data from the arithmetic processing unit 11 and converts the communication signals from the network into data of the format processable by the arithmetic processing unit 11.

Here, if the CMOS model generating program and other programs and the model basic information and other information are not stored, the CMOS generating apparatus 1 may be constructed such that a recording medium storing the CMOS model generating program and other programs and a recording medium storing the model basic information is installed in the storage unit 14 via the external storage unit 16 or the CMOS generating apparatus 1 may be constructed such that the CMOS model generating program and other programs and the model basic information and other information are downloaded to the CMOS generating apparatus 1 via the network from a server (not shown) administering these CMOS model generating program, etc. and model basic information, etc. Further, the CMOS generating apparatus 1 may be constructed such that data such as the model information and the like of the generated CMOS model are stored in a recording medium via the external storage unit 16.

Various inventions are disclosed as above in this specification, and main ones are summarized as follows.

A first mode is directed to a CMOS model generating apparatus for generating a CMOS model, in which the CMOS model is generated based on values of parameters of an n-channel MOS transistor model and a p-channel MOS transistor model in states of corner conditions FF, SS, FS and SF and a typical condition TT and reflecting a distribution of occurrence frequencies in a relationship between a saturation current $I_n$ of the n-channel MOS transistor and a saturation current $I_p$ of the p-channel MOS transistor, comprising a mapping section for converting an $I_n$-$I_p$ space defined by the saturation current $I_n$ of the n-channel MOS transistor and the saturation current $I_p$ of the p-channel MOS transistor into an $x_n$-$x_p$ space defined by a parameter $x_n$ indicating the degree of variation of the saturation current $I_n$ of the n-channel MOS transistor in the CMOS model and a parameter $x_p$ indicating the degree of variation of the saturation current $I_p$ of the p-channel MOS transistor in the CMOS model; an ellipse calculating section for determining an ellipse fitting to converted points of the corner conditions FF, SS, FS and SF by the mapping section with a converted point of the typical condition TT by the mapping section as a center; and a Gaussian distribution calculating section for expressing two independent principal components in the form of a Gaussian distribution using the major and minor axes of the ellipse as axes of the principal components and obtaining a probability distribution determining deviations of the Gaussian distribution such that the cumulative probability within the ellipse becomes equal to the one presumed by the corner conditions FF, SS, FS and SF as the CMOS model.

A second mode is directed to a CMOS model generating method for generating a CMOS model, in which the CMOS model is generated based on values of parameters of an n-channel MOS transistor model and a p-channel MOS transistor model in states of corner conditions FF, SS, FS and SF and a typical condition TT and reflecting a distribution of occurrence frequencies in a relationship between a saturation current $I_n$ of the n-channel MOS transistor and a saturation current $I_p$ of the p-channel MOS transistor, comprising a mapping step of converting an $I_n$-$I_p$ space defined by the saturation current $I_n$ of the n-channel MOS transistor and the saturation current $I_p$ of the p-channel MOS transistor into an $x_n$-$x_p$ space defined by a parameter $x_n$ indicating the degree of variation of the saturation current $I_n$ of the n-channel MOS transistor in the CMOS model and a parameter $x_p$ indicating the degree of variation of the saturation current $I_p$ of the p-channel MOS transistor in the CMOS model; an ellipse calculating step of determining an ellipse fitting to converted points of the corner conditions FF, SS, FS and SF by the mapping section with a converted point of the typical condition TT by the mapping section as a center; and a Gaussian distribution calculating step of expressing two independent principal components in the form of a Gaussian distribution using the major and minor axes of the ellipse as axes of the principal components and obtaining a probability distribution determining deviations of the Gaussian distribution such that the cumulative probability within the ellipse becomes equal to the one presumed by the corner conditions FF, SS, FS and SF as the CMOS model.

A third mode is directed to a CMOS model generating program executed on a computer for generating a CMOS model, in which the CMOS model is generated based on values of parameters of an n-channel MOS transistor model and a p-channel MOS transistor model in states of corner conditions FF, SS, FS and SF and a typical condition TT and reflecting a distribution of occurrence frequencies in a relationship between a saturation current $I_n$ of the n-channel MOS transistor and a saturation current $I_p$ of the p-channel MOS transistor, comprising a mapping step of converting an $I_n$-$I_p$ space defined by the saturation current $I_n$ of the n-channel MOS transistor and the saturation current $I_p$ of the p-channel MOS transistor into an $x_n$-$x_p$ space defined by a parameter $x_n$ indicating the degree of variation of the saturation current $I_n$ of the n-channel MOS transistor in the CMOS model and a parameter $x_p$ indicating the degree of variation of the saturation current $I_p$ of the p-channel MOS transistor in the CMOS model; an ellipse calculating step of determining an ellipse fitting to converted points of the corner conditions FF, SS, FS and SF by the mapping section with a converted point of the typical condition TT by the mapping section as a center; and a Gaussian distribution calculating step of expressing two independent principal components in the form of a Gaussian distribution using the major and minor axes of the ellipse as axes of the principal components and obtaining a probability distribution determining deviations of the Gaussian distribution such that the cumulative probability within the ellipse becomes equal to the one presumed by the corner conditions FF, SS, FS and SF as the CMOS model.

According to the CMOS model generating apparatus, CMOS model generating method and CMOS model generating program constructed as above, it is possible to generate a CMOS model reflecting the distribution of occurrence frequencies in the relationship between the saturation current $I_n$ of the n-channel MOS transistor and the saturation current $I_p$ of the p-channel MOS transistor. Since such a CMOS model can be generated, a characteristic in an integrated circuit of a CMOS can be evaluated in consideration of the distribution of occurrence frequencies in the relationship between the saturation current $I_n$ of the n-channel MOS transistor and the saturation current $I_p$ of the p-channel MOS transistor, wherefore a distribution of characteristic variation of the integrated circuit can be determined.

A CMOS model generating apparatus according to a fourth mode is the CMOS model generating apparatus according to the first mode and further comprising a characteristic distribution calculating section for generating parameter values of $x_n$ and $x_p$ by generating random numbers in such a manner as to comply with the Gaussian distribution determined by the Gaussian distribution calculating section in order to execute a Monte Carlo analysis for determining a distribution of a characteristic of a CMOS.

A CMOS model generating method according to a fifth mode is the CMOS model generating method according to the second mode and further comprising a characteristic distribution calculating step for generating parameter values of $x_n$ and $x_p$ by generating random numbers in such a manner as to comply with the Gaussian distribution determined by the Gaussian distribution calculating section in order to execute a Monte Carlo analysis for determining a distribution of a characteristic of a CMOS.

A CMOS model generating program according to a sixth mode is the CMOS model generating program according to the third mode and further comprising a characteristic distribution calculating step for generating parameter values of $x_n$ and $x_p$ by generating random numbers in such a manner as to comply with the Gaussian distribution determined by the Gaussian distribution calculating section in order to execute a Monte Carlo analysis for determining a distribution of a characteristic of a CMOS.

According to the CMOS model generating apparatus, CMOS model generating method and CMOS model generating program constructed as above, the CMOS model can represent distributions of variation in the nMOS and pMOS only by two parameters of $x_n$ and $x_p$. Therefore, a distribution of a certain characteristic of a CMOS can be determined by executing a Monte Carlo analysis through the variation of only these two parameters of $x_n$ and $x_p$.

A seventh mode is directed to a recording medium storing a CMOS model generating program executed on a computer for generating a CMOS model, in which the CMOS model is generated based on values of parameters of an n-channel MOS transistor model and a p-channel MOS transistor model in states of corner conditions FF, SS, FS and SF and a typical condition TT and reflecting a distribution occurrence frequencies in a relationship between a saturation current $I_n$ of the n-channel MOS transistor and a saturation current $I_p$ of the p-channel MOS transistor, the CMOS model generating program comprising a mapping step of converting an $I_n$-$I_p$ space defined by the saturation current $I_n$ of the n-channel MOS transistor and the saturation current $I_p$ of the p-channel MOS transistor into an $x_n$-$x_p$ space defined by a parameter $x_n$ indicating the degree of variation of the saturation current $I_n$ of the n-channel MOS transistor in the CMOS model and a parameter $x_p$ indicating the degree of variation of the saturation current $I_p$ of the p-channel MOS transistor in the CMOS model; an ellipse calculating step of determining an ellipse fitting to converted points of the corner conditions FF, SS, FS and SF by the mapping section with a converted point of the typical condition TT by the mapping section as a center; and a Gaussian distribution calculating step of expressing two independent principal components in the form of a Gaussian distribution using the major and minor axes of the ellipse as axes of the principal components and obtaining a probability distribution determining deviations of the Gaussian distribution such that the cumulative probability within the ellipse becomes equal to the one presumed by the corner conditions FF, SS, FS and SF as the CMOS model.

With such a construction, there can be provided a recording medium storing a CMOS model program capable of generating a CMOS model reflecting the distribution of occurrence frequencies in the relationship between the saturation current $I_n$ of the n-channel MOS transistor and the saturation current $I_p$ of the p-channel MOS transistor.

A recording medium according to an eighth mode is the recording medium according to the seventh mode, wherein the CMOS model generating program further comprises a characteristic distribution calculating step for generating parameter values of $x_n$ and $x_p$ by generating random numbers in such a manner as to comply with the Gaussian distribution determined by the Gaussian distribution calculating section in order to execute a Monte Carlo analysis for determining a distribution of a characteristic of a CMOS.

With such a construction, there can be provided a recording medium storing a CMOS model program capable of determining a distribution of a certain characteristic of a CMOS by executing the Monte Carlo analysis through the variation of only two parameters of $x_n$ and $x_p$ of the CMOS model.

For the representation of the invention, the invention was suitably and sufficiently described above by way of the embodiment while referring to the drawings. It should be appreciated that a person skilled in the art can easily modify and/or improve the above embodiment. Thus, such a modification and/or improvement should be interpreted to be embraced by the scope of the invention as claimed unless a modification or improvement made by the person skilled in the art departs from the scope of the invention as claimed.

INDUSTRIAL APPLICABILITY

According to the present invention, there can be provided technology for generating a CMOS model in consideration of distributions of variation in an n-channel MOS transistor and a p-channel MOS transistor.

The invention claimed is:

1. A complementary metal oxide semiconductor (CMOS) model generating apparatus for generating a CMOS model, in which:
the CMOS model is generated based on values of parameters of an n-channel metal oxide semiconductor (MOS) transistor model and a p-channel MOS transistor model in states of corner conditions FF, SS, FS and SF and a typical condition TT and reflecting a distribution of occurrence frequencies in a relationship between a saturation current $I_n$ of the n-channel MOS transistor and a saturation current $I_p$ of the p-channel MOS transistor, and when a typical characteristic with a largest occurrence frequency which can be a statistical typical value is assumed as the typical condition TT in an $I_n$-$I_p$ space and characteristics with smaller occurrence frequencies than the statistical representative value are assumed as the corner conditions FF, SS, FS and SF in the $I_n$-$I_p$ space in a scatter diagram showing the relationship between the saturation current $I_n$ of the n-channel MOS transistor and the saturation current $I_p$ of the p-channel MOS transistor, the conditions TT, FF, SS, FS and SF are given beforehand, the apparatus comprising:

a processor executing instructions to perform as the following:

a mapping section for converting an $I_n$-$I_p$ space defined by the saturation current $I_n$ of the n-channel MOS transistor and the saturation current $I_p$ of the p-channel MOS transistor into an $x_n$-$x_p$ space defined by a parameter $x_n$ indicating the degree of variation of the saturation current $I_n$ of the n-channel MOS transistor in the CMOS model and a parameter $x_p$ indicating the degree of variation of the saturation current $I_p$ of the p-channel MOS transistor in the CMOS model such that the conditions TT, FF and SS in the $I_n$-$I_p$ space become (0, 0), (a, a) and (−a, −a) in the $x_n$-$x_p$ space, "a" being a predetermined value;

an ellipse calculating section for determining an ellipse fitting to converted points of the corner conditions FF, SS, FS and SF by the mapping section with a converted point of the typical condition TT by the mapping section as a center; and a Gaussian distribution calculating section for expressing two independent principal components in the form of a Gaussian distribution using the major and minor axes of the ellipse as axes of the principal components and obtaining a probability distribution determining deviations of the Gaussian distribution such that the cumulative probability within the ellipse becomes equal to the one presumed by the corner conditions FF, SS, FS and SF as the CMOS model.

2. A CMOS model generating apparatus according to claim 1, further comprising a characteristic distribution calculating section for generating parameter values of $x_n$ and $x_p$ by generating random numbers in such a manner as to comply with the Gaussian distribution determined by the Gaussian distribution calculating section in order to execute a Monte Carlo analysis for determining a distribution of a characteristic of a CMOS.

3. A complementary metal oxide semiconductor (CMOS) model generating method for generating a CMOS model, in which:

the CMOS model is generated based on values of parameters of an n-channel metal oxide semiconductor (MOS) transistor model and a p-channel MOS transistor model in states of corner conditions FF, SS, FS and SF and a typical condition TT and reflecting a distribution of occurrence frequencies in a relationship between a saturation current $I_n$ of the n-channel MOS transistor and a saturation current $I_p$ of the p-channel MOS transistor, and when a typical characteristic with a largest occurrence frequency which can be a statistical typical value is assumed as the typical condition TT in an $I_n$-$I_p$ space and characteristics with smaller occurrence frequencies than the statistical representative value are assumed as the corner conditions FF, SS, FS and SF in the $I_n$-$I_p$ space in a scatter diagram showing the relationship between the saturation current $I_n$ of the n-channel MOS transistor and the saturation current $I_p$ of the p-channel MOS transistor, the conditions TT, FF, SS, FS and SF are given beforehand, the method comprising:

a mapping step, executed by a computer, of converting an $I_n$-$I_p$ space defined by the saturation current $I_n$ of the n-channel MOS transistor and the saturation current $I_p$ of the p-channel MOS transistor into an $x_n$-$x_p$ space defined by a parameter $x_n$ indicating the degree of variation of the saturation current $I_n$ of the n-channel MOS transistor in the CMOS model and a parameter $x_p$ indicating the degree of variation of the saturation current $I_p$ of the p-channel MOS transistor in the CMOS model such that the conditions TT, FF and SS in the $I_n$-$I_p$ space become (0, 0), (a, a) and (−a, −a) in the $x_n$-$x_p$ space, "a" being a predetermined value;

an ellipse calculating step, executed by a computer, of determining an ellipse fitting to converted points of the corner conditions FF, SS, FS and SF by the mapping section with a converted point of the typical condition TT by the mapping section as a center; and a Gaussian distribution calculating step, executed by a computer, of expressing two independent principal components in the form of a Gaussian distribution using the major and minor axes of the ellipse as axes of the principal components and obtaining a probability distribution determining deviations of the Gaussian distribution such that the cumulative probability within the ellipse becomes equal to the one presumed by the corner conditions FF, SS, FS and SF as the CMOS model.

4. A recording medium storing a complementary metal oxide semiconductor (CMOS) model generating program executed on a computer for generating a CMOS model, in which the CMOS model is generated based on values of parameters of an n-channel metal oxide semiconductor (MOS) transistor model and a p-channel MOS transistor model in states of corner conditions FF, SS, FS and SF and a typical condition TT and reflecting a distribution of occurrence frequencies in a relationship between a saturation current $I_n$ of the n-channel MOS transistor and a saturation current $I_p$ of the p-channel MOS transistor, the CMOS model generating program being characterized in that when a typical characteristic with a largest occurrence frequency which can be a statistical typical value is assumed as the typical condition TT in an $I_n$-$I_p$ space and characteristics with smaller occurrence frequencies than the statistical representative value are assumed as the corner conditions FF, SS, FS and SF in the $I_n$-$I_p$ space in a scatter diagram showing the relationship between the saturation current $I_n$ of the n-channel MOS transistor and the saturation current $I_p$ of the p-channel MOS transistor, the conditions TT, FF, SS, FS and SF are given beforehand, and being characterized by comprising:

a mapping step of converting an $I_n$-$I_p$ space defined by the saturation current $I_n$ of the n-channel MOS transistor and the saturation current $I_p$ of the p-channel MOS transistor into an $x_n$-$x_p$ space defined by a parameter $x_n$ indicating the degree of variation of the saturation current $I_n$ of the n-channel MOS transistor in the CMOS model and a parameter $x_p$ indicating the degree of variation of the saturation current $I_p$ of the p-channel MOS transistor in the CMOS model such that the conditions TT, FF and SS in the $I_n$-$I_p$ space become (0, 0), (a, a) and (−a, −a) in the $x_n$-$x_p$ space, "a" being a predetermined value;

an ellipse calculating step of determining an ellipse fitting to converted points of the corner conditions FF, SS, FS and SF by the mapping section with a converted point of the typical condition TT by the mapping section as a center; and a Gaussian distribution calculating step of expressing two independent principal components in the form of a Gaussian distribution using the major and minor axes of the ellipse as axes of the principal components and obtaining a probability distribution determining deviations of the Gaussian distribution such that the cumulative probability within the ellipse becomes equal to the one presumed by the corner conditions FF, SS, FS and SF as the CMOS model.

5. A CMOS model generating apparatus according to claim 1, wherein the mapping section converts the $I_n$-$I_p$ space defined by the saturation current $I_n$ of the n-channel MOS transistor and the saturation current $I_p$ of the p-channel MOS transistor into the $x_n$-$x_p$ space defined by the parameter $x_n$ indicating the degree of variation of the saturation current $I_n$ of the n-channel MOS transistor in the CMOS model and the parameter $x_p$ indicating the degree of variation of the saturation current $I_p$ of the p-channel MOS transistor in the CMOS model such that a saturation current $I_{nF}$ of the condition FF, a saturation current $I_{nS}$ of the condition SS and a saturation current $I_{nT}$ of the condition TT on an axis of the saturation current $I_n$ of the n-channel MOS transistor correspond to 1, −1 and 0 on an axis of $x_n$ and a saturation current $I_{pF}$ of the condition FF, a saturation current $I_{pS}$ of the condition SS and a saturation current $I_{pT}$ of the condition TT on an axis of the saturation current $I_p$ of the p-channel MOS transistor correspond to 1, −1 and 0 on an axis of $x_p$.

6. A CMOS model generating apparatus according to claim 5, further comprising a characteristic distribution calculating section for generating parameter values of $x_n$ and $x_p$ by generating random numbers in such a manner as to comply with the Gaussian distribution determined by the Gaussian distribution calculating section in order to execute a Monte Carlo analysis for determining a distribution of a characteristic of a CMOS.

* * * * *